(12) United States Patent
Wu

(10) Patent No.: US 8,604,521 B2
(45) Date of Patent: Dec. 10, 2013

(54) OPTICALLY CONTROLLED READ ONLY MEMORY

(75) Inventor: Yi-Tyng Wu, Chia-I (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 797 days.

(21) Appl. No.: 12/196,261

(22) Filed: Aug. 21, 2008

(65) Prior Publication Data

US 2010/0044813 A1 Feb. 25, 2010

(51) Int. Cl.
| | | |
|---|---|---|
| H01L 27/148 | (2006.01) | |
| H01L 23/52 | (2006.01) | |
| H01L 31/062 | (2012.01) | |
| H01L 31/113 | (2006.01) | |
| H01L 21/02 | (2006.01) | |
| H01L 31/00 | (2006.01) | |
| H01L 21/00 | (2006.01) | |
| G11C 5/06 | (2006.01) | |
| G11C 13/04 | (2006.01) | |
| G11C 17/06 | (2006.01) | |
| G11C 11/36 | (2006.01) | |
| G11C 7/02 | (2006.01) | |

(52) U.S. Cl.
USPC ........... 257/225; 257/209; 257/291; 257/295; 257/440; 257/E27.102; 438/57; 438/59; 438/69; 438/70; 365/64; 365/105; 365/112; 365/115; 365/207; 365/215

(58) Field of Classification Search
None
See application file for complete search history.

(56) References Cited

U.S. PATENT DOCUMENTS

| | | | | |
|---|---|---|---|---|
| 3,488,636 | A * | 1/1970 | Dyck | 365/105 |
| 7,042,752 | B2 * | 5/2006 | Okuda | 365/112 |
| 2005/0140805 | A1 * | 6/2005 | Han | 348/279 |
| 2006/0086956 | A1 * | 4/2006 | Furukawa et al. | 257/291 |
| 2006/0278896 | A1 * | 12/2006 | Inoue | 257/215 |
| 2007/0161141 | A1 * | 7/2007 | Lin et al. | 438/48 |
| 2008/0149974 | A1 * | 6/2008 | Song | 257/292 |

* cited by examiner

Primary Examiner — Michael Jung
(74) Attorney, Agent, or Firm — Winston Hsu; Scott Margo

(57) ABSTRACT

An optically controlled read only memory is disclosed. The optically controlled read only memory includes a substrate, a plurality of memory cells having optical sensors disposed on the substrate, and at least one shielding structure disposed on the optical sensor, in which the shielding structure selectively shields a portion of the optical sensor according to a predetermined layout. Preferably, the optically controlled read only memory of the present invention is capable of providing two types or more program codes and outputting different program codes carrying different function under different lighting condition.

13 Claims, 6 Drawing Sheets

OPTICALLY CONTROLLED READ ONLY MEMORY

BACKGROUND OF THE INVENTION

1. Field of the Invention

The present invention relates to a read only memory, and more particularly, to an optically controlled read only memory that is capable of generating specific program code after being illuminated by light.

2. Description of the Prior Art

Read only memory (ROM) is a form of semiconductor memory, which is commonly utilized in electronic computing systems that do not require frequent data alteration, in which file folders of this kind of system would not be erased as the power is being turned off. Applications of this type of system also include basic input output system (BIOS) for personal computers, other micro-computing systems, portable electronic products, home appliances, or firmware within toys.

Commercial read only memories today are roughly divided into following four categories: 1) Programmable Read Only Memory (PROM); 2) Erasable Programmable Read Only Memory (EPROM); 3) One Time Programmable Read Only Memory (OTPROM); and 4) Electrically Erasable Programmable Read Only Memory (EEPROM). PROM includes determinant fuses that can be cut off by electrical current (by the user) for writing required data or program. However, as a burn is made, it cannot be altered. EPROM is typically programmed by using high voltage and erased by exposure of ultraviolet light. As the data is erased, the ROM can be reused again. A quartz window is commonly formed on the package housing of EPROM for exposure purpose. The writing mechanism of OTPROM is similar to that of EPROM. However in order to reduce cost, codes being programmed is not erased, thus no window is being formed in this type of memory. The operation of EEPROM is similar to that of EPROM. However, the erasing method for this type of memory is achieved by high electrical field, thus no window is required.

Depending on the operation including read, erase, and program of a memory, the structure and fabrication process for each read only memory also differs accordingly. An example of a read only memory is disclosed in U.S. Pat. No. 5,959,877. Referring to FIG. 1, FIG. 1 illustrates a structural view of a read only memory according to the prior art. As shown in FIG. 1, the read only memory is fabricated on a substrate 1, in which the substrate 1 includes a plurality of n-type doping regions 2-1, 2-2, 2-3, 2-4, 2-5, 2-6, a plurality of insulating films 3-1, 3-2, 3-3, 3-4, 3-5, and a plurality of polysilicon films 4-1, 4-2, 4-3, 4-4, 4-5 disposed on the insulating films. Preferably, the polysilicon films, the insulating films disposed under the polysilicon films, and the n-type doping regions formed at two sides of the above films are used to define a plurality of n-channel MOS transistor (hereinafter would be referred to as NMOS transistors). Each of the polysilicon film, serving as the gate of the NMOS transistor is electrically connected to corresponding word lines, and the n-type doping regions are the source/drain of the NMOS transistor. The read only memory also includes a first metal wiring layer 5-1, 5-2, 5-3, 5-4, 5-5, 5-6 and a second metal wiring layer 6-1, 6-2, 6-3, 6-4, 6-5, 6-6. A plurality of via plugs 10-1, 10-2, 10-5, 10-6 are disposed between a portion of the first metal wiring layer and the second metal wiring layer, and the first wiring layer 5-1, 5-2, 5-3, 5-4, 5-5, 5-6 is electrically connected to the n-type doping regions 2-1, 2-2, 2-3, 2-4, 2-5, 2-6 through the via plugs.

The second metal wiring layer 6-2, 6-3, 6-4, 6-5 preferably serving as the bit line $BL_0$, $BL_1$, $BL_2$, $BL_3$ of the read only memory, and the intersecting region of the word lines and the bit lines is a memory cell for storing data, in which the bit lines $BL_0$, $BL_1$ are electrically connected to the n-type doping region 2-2, 2-5 through the via plug 10-2, 10-5. While the read only memory is fabricated, the presence of the via plug disposed between the first metal wiring layer and the second metal wiring layer would determine the message data stored in the memory cell to be either "0" or "1", thereby constituting the program code of the read only memory. Therefore, voltage comes from the bit line would turn on the NMOS transistor through the connected gate and at the same time apply a precharge potential while the data stored in the read only memory is read. As the via plugs 10-2, 10-5 are electrically connected to the second metal wiring layer 6-2, 6-5, the first metal wiring layer 5-2, 5-5, and the n-type doping regions 2-2, 2-5, and causing the potential of the bit lines $BL_0$ and $BL_3$ to be lower than the precharge potential, such as a ground potential, the bit lines $BL_1$ and $BL_2$ maintained at precharge potential would read data stored in the memory cell as "0", whereas the bit lines $BL_0$ and $BL_3$ below the precharge potential would read data stored in the memory cell as "1".

It is evident that the conventional read only memories not only come with a unique structure and fabricate with great complexity, in which the program code embedded therein is fundamentally decided during wafer fabrication stage. Moreover, certain operation procedure is required to write required data or firmware into the memory, and only one single program code is stored into the memory at a time. The conventional read only memory undoubtedly causes great inconvenience and carries virtually no variability.

SUMMARY OF THE INVENTION

It is an objective of the present invention to provide a read only memory that can by controlled optically as well as electrically and a method for fabricating the same.

An optically controlled read only memory is disclosed. The optically controlled read only memory includes: a substrate; a plurality of memory cells disposed on the substrate, in which each of the memory cells comprises an optical sensor; and a plurality of shielding structures disposed on the optical sensor, wherein the shielding structures selectively shield a number of the optical sensors according to a predetermined layout.

The optically controlled read only memory of the present invention preferably uses the semi transparent or opaque shielding structures to shield a number of the optical elements according to a predetermined layout, thereby generating a predetermined program code. For instance, ambient light could directly reach the optical sensor to trigger a corresponding electronic signal, such that the program code for the memory cell to be defined as "1", whereas the program code representing the memory cell having optical sensor blocked by the shielding structure is defined as "0". Preferably, the optically controlled read only memory of the present invention is capable of providing two types or more program codes and outputting different program codes carrying different function under different lighting conditions.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
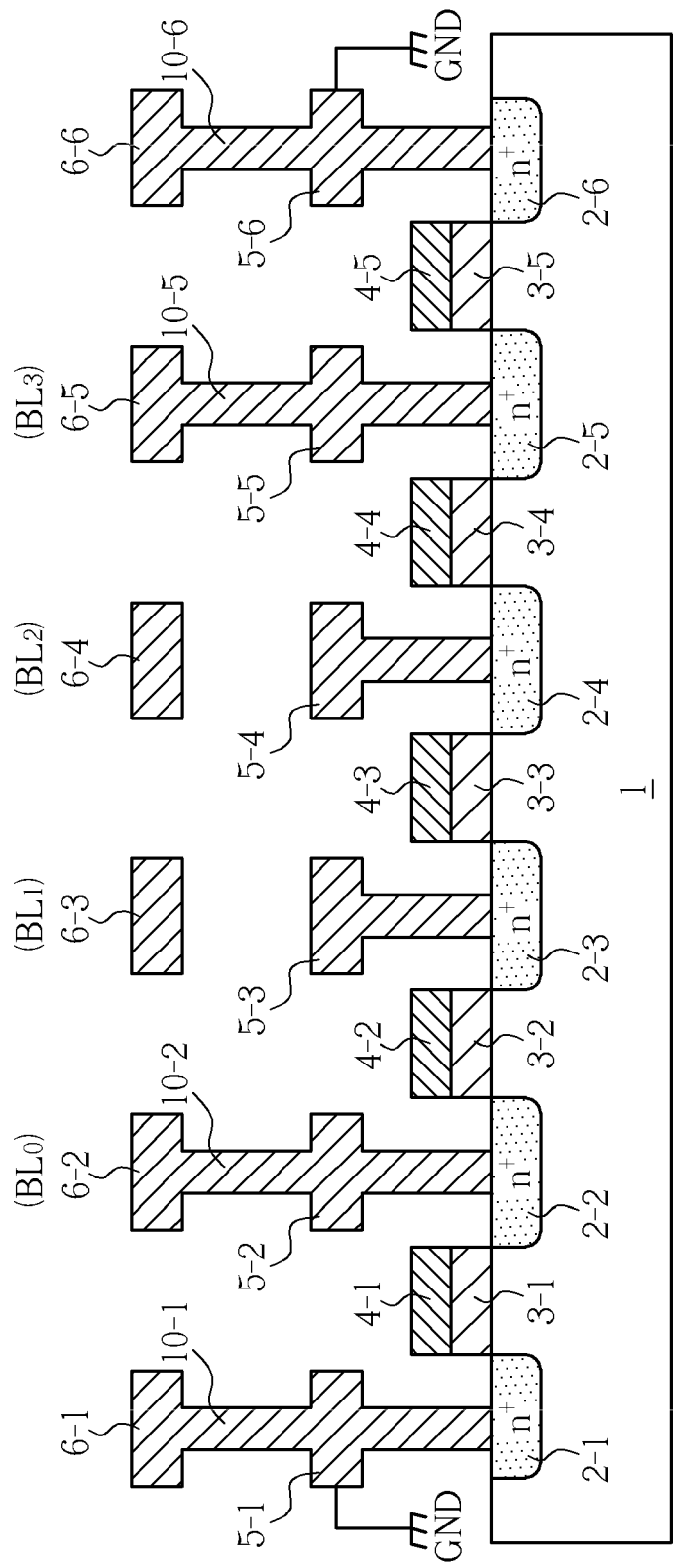
FIG. 1 illustrates a structural view of a read only memory according to the prior art.
Figure 2:
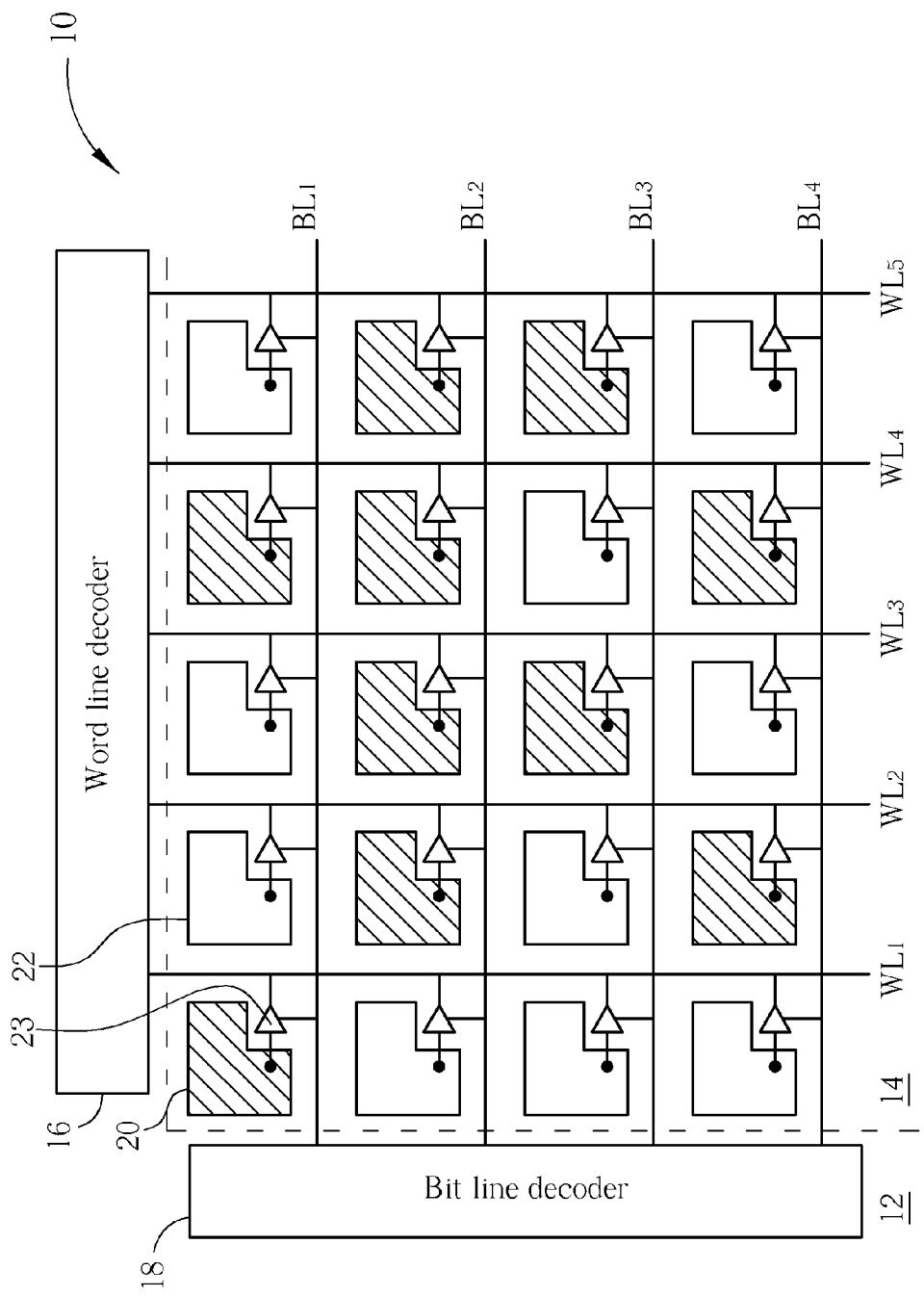
FIG. 2 illustrates an optically controlled read only memory according to a preferred embodiment of the present invention.

Referring to FIG. 2, FIG. 2 illustrates an optically controlled read only memory according to a preferred embodiment of the present invention. As shown in FIG. 2, the optically controlled read only memory 10 includes a peripheral circuit region 12 and a memory array region 14. The peripheral circuit region 12 includes a word line decoder 16 electrically connected to a plurality of word lines situated in the memory array region 14, and a bit line decoder 18 electrically connected to a plurality of bit lines situated in the memory array region 14. Each of the word line decoder 16 and the bit line decoder 18 is electrically connected to a corresponding voltage generator (not shown) for providing electrical potential to the optically controlled read only memory 10.

As shown in FIG. 2, the memory array region 14 also includes a plurality of intersecting bit lines and word lines, such as the bit lines BL1, BL2, BL3, BL4, word lines WL1, WL2, WL3, WL4, and memory cells 20, 22 disposed between the bit lines and word lines. Each word line is electrically connected to a predetermined memory cell within the memory array region 14, and at the same time each memory cell is electrically connected to a corresponding bit line. Preferably, each memory cell also includes an optical sensor and an active device 23, such as a MOS transistor or an active amplifier. Among which, a plurality of shielding structures (such as the shadow region of the memory cell 20 shown in FIG. 2) disposed on a number of the optical sensors, along with other memory cells 22 having no shielding structure thereon, are used to define a "0" or "1" state of the program code of the optically controlled read only memory of the present invention. Hence, the memory cells situated in the memory array region 14 of the optically controlled read only memory 10 can be used to store a predetermined program code.

Figure 3:
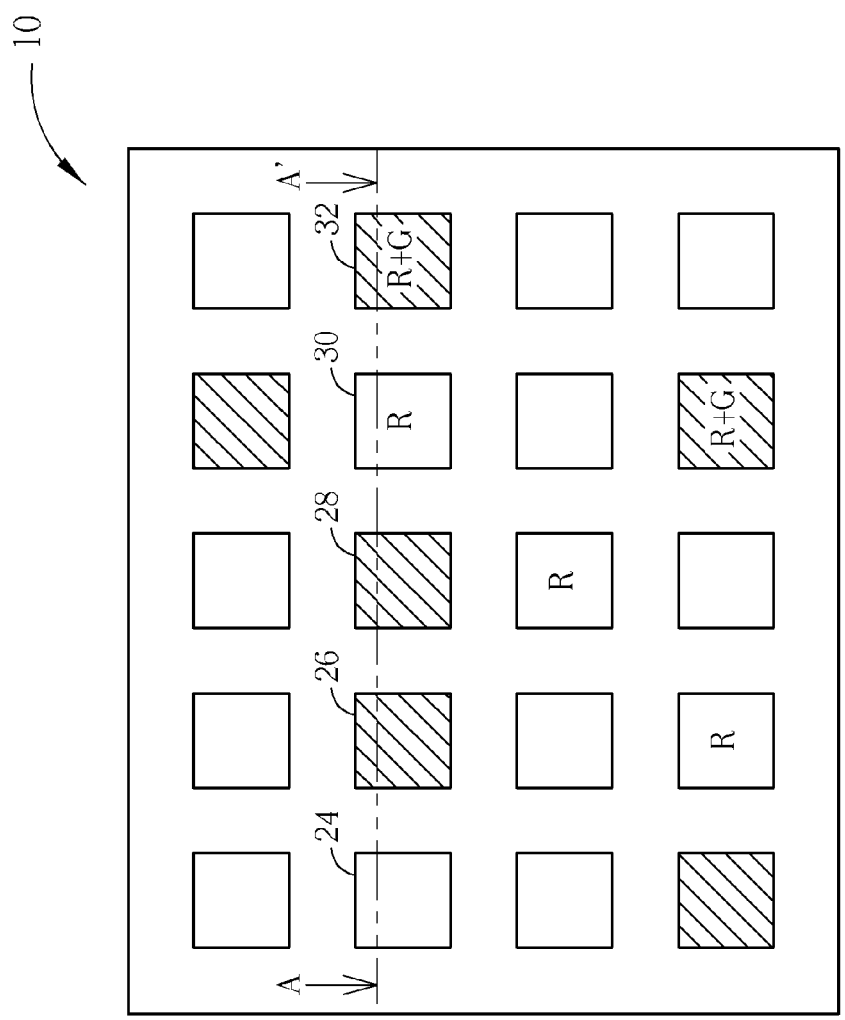
FIG. 3 illustrates a top view of the memory array region of the optically controlled read only memory of the present invention.
Figure 4:
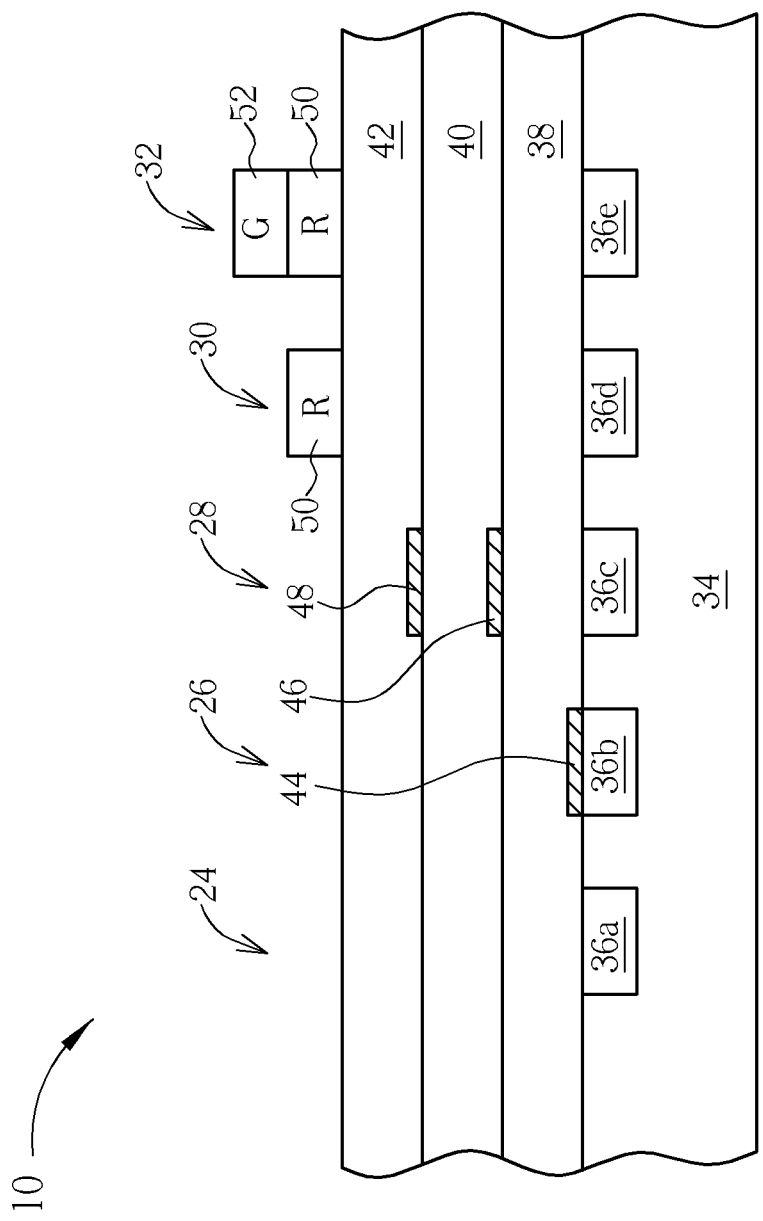
FIG. 4 illustrates a cross-sectional view of FIG. 3 along the sectional line AA'.

Referring to FIGS. 3-4, FIGS. 3-4 illustrate a perspective view of the memory array region 14 of the optically controlled read only memory 10 shown in FIG. 2. For simplicity purpose, the bit lines, word lines, and active devices are omitted in these figures. FIG. 3 depicts a top view of a layout of the memory cells and FIG. 4 depicts a cross-sectional view of FIG. 3 along the sectional line AA'. The memory cells of the optically controlled read only memory 10 of the present invention can be arranged according to a linear manner, a matrix manner or a triangular manner, and the memory cells 24, 26, 28, 30, 32 from the second column is to be further explained below.

As shown in FIGS. 3-4, the memory cells 24, 26, 28, 30, 32 are situated on a substrate 32, such as a semiconductor substrate, in which each of the memory cells is placed to correspond an optical sensor 36a, 36b, 36c, 36d, 36e. These optical sensors are also arranged according to a matrix on the substrate, in which the optical sensor 36 can be a photodiode such as charge coupled device (CCD) or CMOS image sensor (CIS). The memory cells 24, 26, 28, 30, 32 also include a plurality of dielectric layers 38, 40, 42 (such as inter-metal dielectrics, IMD) formed on the substrate 32 and the optical sensors 36, in which these dielectric layers are capable of allowing light to pass through. Additional processes such as salicide process, multilevel interconnection process, color filter process, or black matrix process may also be integrated along with the aforementioned process, thereby forming a shielding structure in the memory cells 24, 26, 28, 30, 32.

The memory cell 24 only includes one optical sensor 36a, and as no shielding structure is disposed on top of the optical sensor 36a, light outside the memory cell 24 could penetrate the dielectric layers 38, 40, 42 to reach the optical sensor 36a and triggers a corresponding electronic signal, and one bit of data is recorded, such as "1" of a program code. Conversely, shielding structures are disposed on top of the optical sensors 36b, 36c, 36d, 36e of the memory cells 26, 28, 30, 32, such as the silicide 44 within the memory cell 26, the first patterned metal layer 46 and the second patterned metal layer 48 disposed on top of the optical sensor 36c of the memory cell 28. Theses structure, such as the silicide 44, the first patterned metal layer 46, and the second patterned metal layer 48 readily block light from entering the memory cells 26, 28 and also prevent light from reaching the optical sensors 36b, 36c. As a result, another bit of data is recorded or treated to be existed, such as "0" of a program code.

A first color filter 50 serving as a semi transparent layer is disposed on the dielectric layer 42 of the memory cell 30, whereas a first color filter 50 and an additional second color filter 52 together serving as an opaque layer is formed in the memory cell 32. As an ambient light, such as a white light or a red light enters, it could selectively penetrate the red first color filter 50 and directly reach the optical sensor 36d of the memory cell 30. This records one bit of data, such as "1" of a program code. However, as the memory cell 32 contains a color filter with two different filtering colors, such as the green second color filter 52 and the red first color filter 50 disposed underneath, and as the green second color filter 52 blocks all light other than green light from entering the first color filter 50, and the first color filter 50 blocks all light other than red light from entering the dielectric layer 42, the optical sensor 36e would not trigger an electronic signal eventually. As a result, another bit of data is recorded, such as "0" of a program code.

By using the aforementioned semi transparent or opaque pattern to selectively shield a number of the optical sensors according to a predetermined layout, the present invention could input a predetermined program code. For instance, an ambient light could directly reach the optical sensor to trigger corresponding electronic signal such that the program code of the memory cell is defined as "1", whereas the program code of the memory cells having shielding structure thereby blocking light from reaching the optical sensor is defined as "0". Alternatively, program code of those memory cells allowing lights to reach the optical sensors for triggering corresponding electronic signals could be defined as "0", whereas the program code of those having shielding structure thereby preventing lights from reaching the optical sensors is defined as "1", which are all within the scope of the present invention. Accordingly, the program code stored in the read only memory is controlled, in which the program code is preferably controlled both electrically and optically.

Figure 5:
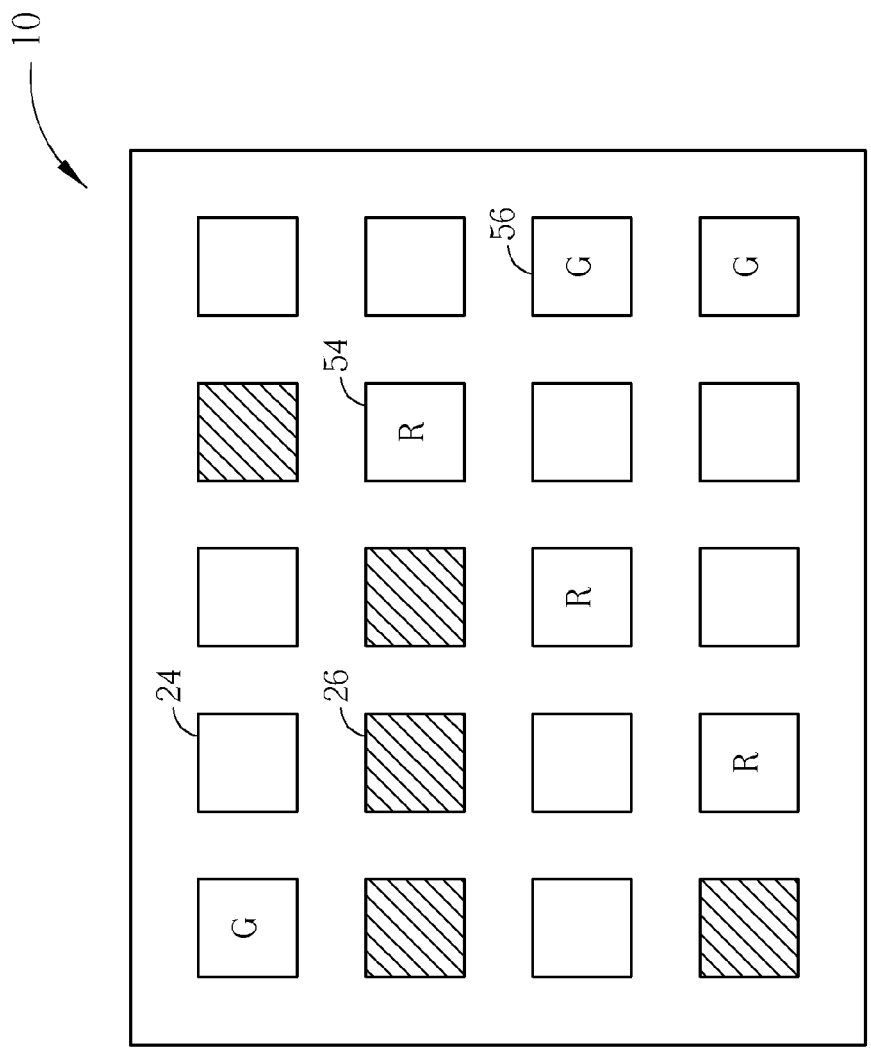
FIG. 5 illustrates an optically controlled read only memory according to an embodiment of the present invention.

Referring to FIG. 5, FIG. 5 illustrates another optically controlled read only memory according to an embodiment of the present invention. For simplicity purpose, the bit lines, word lines, and active devices are omitted in the figure, and the numbering of similar devices is consistent with the ones disclosed in the aforementioned embodiment. As shown in FIG. 5, the memory cell 24 includes only one optical sensor (not shown), in which no shielding structure is disposed on top of the optical sensor. Ambient light could therefore penetrate dielectric layer (not shown) to reach the optical sensor directly and trigger a corresponding electronic signal. As a result, a bit of data is recorded, such as "1" of a program code. An opaque pattern, such as a silicide, a metal plug, a patterned metal layer, a black matrix, or a color filter having at least two different filtering colors is disposed on the optical sensor of the memory cell 26, such that when light enters the memory cell 26, it would be blocked by this opaque pattern and unable to reach the optical sensor within the memory cell 26. As a result, another bit of data is recorded, such as "0" of a program code. A semi transparent pattern, such as a red color filter and a green color filter, is disposed on each optical sensor of the memory cells 54, 56, such that only a light source having specific wavelength would be able to trigger a corresponding electronic signal. For instance, when the memory cell 54 is irradiated by white light or red light, or the memory cell 56 is irradiated by white light or green light, one bit of data is recorded, such as "1" of a program code. Conversely, when light having other wavelengths is used to irradiate the memory cells 54, 56, the optical sensors within the memory cells 54, 56 all become insensitive, and as a result, another bit of data is recorded, such as "0" of a program code.

Under different lighting condition, the optically controlled read only memory 10 of the present invention would selectively re-arrange and output different program codes. For instance, when white light irradiates the memory cell, the optical sensors within the memory cells 24, 54, and 56 all become sensitive, and the optical sensor within the memory cell 26 becomes insensitive and constitutes a first program code; when red light irradiates the memory cell, the optical sensors within the memory cells 24 and 54 all become sensitive, and the optical sensors within the memory cells 26 and 56 all become insensitive and constitute a second program code; when green light irradiates the memory cell, the optical sensors within the memory cells 24 and 56 all become sensitive, and the optical sensors within the memory cells 26 and 54 all become insensitive and constitute a third program code. Each of the first program code, the second program code, and the third program code is generated for providing different functionalities.

Figure 6:
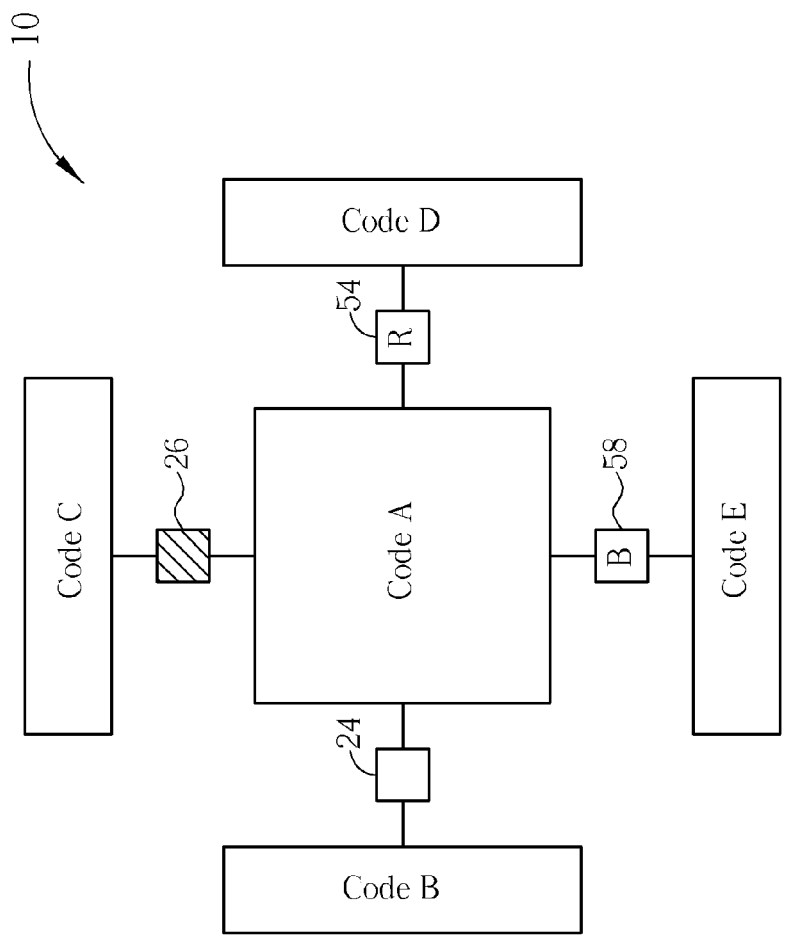
FIG. 6 illustrates an optically controlled read only memory according to an embodiment of the present invention.

Referring to FIG. 6, FIG. 6 illustrates an optically controlled read only memory according to an embodiment of the present invention. For simplicity purpose, the bit lines, word lines, and active devices are omitted in the figure, and the numbering of similar devices is consistent with the ones disclosed in the aforementioned embodiment. Preferably, the optically controlled read only memory of this embodiment is specifically utilized as a switch element for controlling different program codes. As shown in FIG. 6, the optically controlled read only memory 10 includes a main core code CODE A, a plurality of subroutine codes CODE B, CODE C, CODE D, CODE E, and a plurality of memory cells 24, 26, 54, 58 coupled between the main core codes and the subroutine codes. As the memory cell 24 includes only one optical sensor (not shown) and contains no shielding structure on the optical sensor, ambient light could penetrate the dielectric layer (not shown) to reach the optical sensor directly and trigger an electronic signal, which can be treated as selecting the subroutine code CODE B. A shielding structure consisting of material such as a silicide, a metal plug, a patterned metal layer, a black matrix, or a color filter having two or more filtering colors is disposed on the optical sensor of the memory cell 26. Hence, when an ambient light is used to irradiate the memory cell 26, it is readily blocked by the shielding structure and unable to reach the optical sensor within the memory cell 26, which would then be treated as not selecting the subroutine code CODE C. A shielding structure composed of a red color filter and a blue color filter is disposed on the optical sensor of the memory cells 54 and 58. Hence, when the memory cell 54 is irradiated by either white light or red light, or the memory cell 58 is irradiated by either white light or blue light, it could be treated as selecting subroutine code CODE D and CODE E. Conversely, as light of other wavelengths is used to irradiate these two memory cells, the optical sensors within the memory cells 54, 58 all become insensitive and could therefore be treated as not selecting subroutine code CODE D and CODE E. Therefore, under different lighting condition, the present invention could generate different combinations of main core codes and subroutine codes thereby outputting different program codes. Additionally, a number of or all of the memory cells within the main core code or subroutine code could be redesigned according to the structure of the memory cell from the aforementioned embodiments, such as the ones having transparent and opaque patterns, such that the main core code or the subroutine codes could produce different program codes under different lighting condition. By using the memory cells 24, 26, 54, 58 to select different subroutine codes and output along with the main core code, a multi-level optically controlled program code could be achieved.

Overall, the optically controlled read only memory of the present invention could be integrated into a photodiode fabrication process, such as the process for fabricating CMOS image sensor. In other words, wafer fabs could mass produce a large quantity of semiconductor wafers having photodiode arrays thereon, and by adjusting the mask layout design for opaque patterns including silicide, via plug, metal layer, or black matrix and for the semi transparent patterns such as color filter to correspond a predetermined program code, the optically controlled read only memory of the present invention could be fabricated and overall cost could be reduced accordingly. Moreover, the optically controlled read only memory of the present invention includes two or more program codes, and is capable of outputting program codes of different functionalities under different lighting condition, which significantly advances from the conventional read only memory that is only capable of storing one single program code at a time and carrying virtually no variation.

Those skilled in the art will readily observe that numerous modifications and alterations of the device and method may be made while retaining the teachings of the invention.

What is claimed is:

1. An optically controlled read only memory, comprising:
   a substrate;
   a plurality of memory cells disposed on the substrate, wherein each of the memory cells comprises an optical sensor; and
   a plurality of first shielding structures disposed directly above a number of the optical sensors for preventing light from entering the shielded optical sensors, wherein a state of at least one predetermined program code of the memory cells is optically controlled by irradiating the shielded and un-shielded optical sensors;
   a dielectric layer covering the optical sensor and the first shielding structures; and
   a plurality of second shielding structures on the dielectric layer and selectively shielding the optical sensors not covered by the first shielding structures.

2. The optically controlled read only memory of claim 1, wherein the optical sensors are selected from a group consisting of photodiodes including charge coupled device (CCD) and CMOS image sensor (CIS).

3. The optically controlled read only memory of claim 1, wherein the shielding structures are opaque layers, and the shielding structures are selected from a group consisting of silicides, metal plugs, metal layers, and stacked color filters with at least two different filtering colors.

4. The optically controlled read only memory of claim 1, wherein the shielding structures are semi transparent layers.

5. The optically controlled read only memory of claim 4, wherein the shielding structures comprise color filters.

6. The optically controlled read only memory of claim 1, further comprising a plurality of word lines, a plurality of bit lines, and a plurality of active devices, wherein each of the active devices is electrically connected to the optical sensors through a corresponding group of word line and bit line.

7. The optically controlled read only memory of claim 6, wherein the active devices comprise MOS transistors or active amplifiers.

8. A method for fabricating an optically controlled read only memory, comprising:
providing a substrate;
forming a plurality of optical sensors on the substrate; and
selectively forming a plurality of first shielding structures directly above a surface of only a number of the optical sensors for preventing light from entering the shielded optical sensors, wherein a state of at least one predetermined program code of the read only memory is optically controlled by irradiating the shielded and un-shielded optical sensors;
forming a dielectric layer to cover the optical sensors and the first shielding structures; and
forming a plurality of second shielding structures on the dielectric layer and selectively shielding the optical sensors not covered by the first shielding structures.

9. The method of claim 8, wherein the first shielding structures comprise silicide layers.

10. The method of claim 8, wherein the step of forming the second shielding structures further comprises a multilevel interconnection process or a color filter process.

11. The method of claim 8, wherein the second shielding structures comprise stacked color filters with at least two different filtering colors.

12. A method for fabricating an optically controlled read only memory, comprising:
providing a substrate;
forming a plurality of optical sensors on the substrate;
forming a dielectric layer on the substrate to cover the optical sensors; and
forming a plurality of shielding structures directly above a surface of the dielectric layer and a number of the optical sensors for preventing light from entering the shielded optical sensors, wherein a state of at least one predetermined program code of the read only memory is optically controlled by irradiating the shielded and un-shielded optical sensors, and the shielding structures comprise stacked color filters with at least two different filtering colors.

13. The method of claim 12, wherein the step of forming the shielding structures further comprise a multilevel interconnection process or a color filter process.

\* \* \* \* \*